(12) United States Patent
Kwok et al.

(10) Patent No.: US 6,373,249 B1
(45) Date of Patent: Apr. 16, 2002

(54) SYSTEM AND METHOD FOR THREE-DIMENSIONAL INTERLEAVED WATER AND FAT IMAGE ACQUISITION WITH CHEMICAL-SHIFT CORRECTION

(75) Inventors: Wingchi E. Kwok, Rochester; Jianhui Zhong, Pittsford; Saara Marjatta Sofia Totterman, Rochester, all of NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 09/573,845

(22) Filed: May 19, 2000

Related U.S. Application Data
(60) Provisional application No. 60/135,212, filed on May 21, 1999.

(51) Int. Cl.[7] .................................................. G01V 3/00
(52) U.S. Cl. ........................................ 324/306; 324/312
(58) Field of Search ................................. 324/306, 307, 324/308, 309, 312, 314

(56) References Cited

U.S. PATENT DOCUMENTS

| | | | |
|---|---|---|---|
| 4,794,337 A | * | 12/1988 | Twieg ........................ 324/309 |
| 4,983,920 A | * | 1/1991 | Lampman et al. .......... 324/309 |
| 6,046,589 A | * | 4/2000 | Lamerichs et al. ......... 324/309 |

OTHER PUBLICATIONS

Schick, "Simultaneous Highly Selective MR Water and Fat Imaging Using a Simple New Type of Spectral–Spatial Excitation", Magn. Reson. Med. 40:194–202 (1998).

* cited by examiner

*Primary Examiner*—Louis Arana
(74) *Attorney, Agent, or Firm*—Blank Rome Comisky & McCauley LLP

(57) ABSTRACT

A magnetic imaging device, such as an MR scanner, is used to provide a modified three-dimensional gradient echo sequence having a spatial-spectral excitation in which phase-encoding lines are interleaved for the excitation of water and of fat. The phase-encoding lines are spaced by an interval equal to half of the repetition time. The resulting data are sorted for the reconstruction of water-only and fat-only images, which are realigned and combined to form water-fat combined images free of chemical shift artifacts.

22 Claims, 16 Drawing Sheets

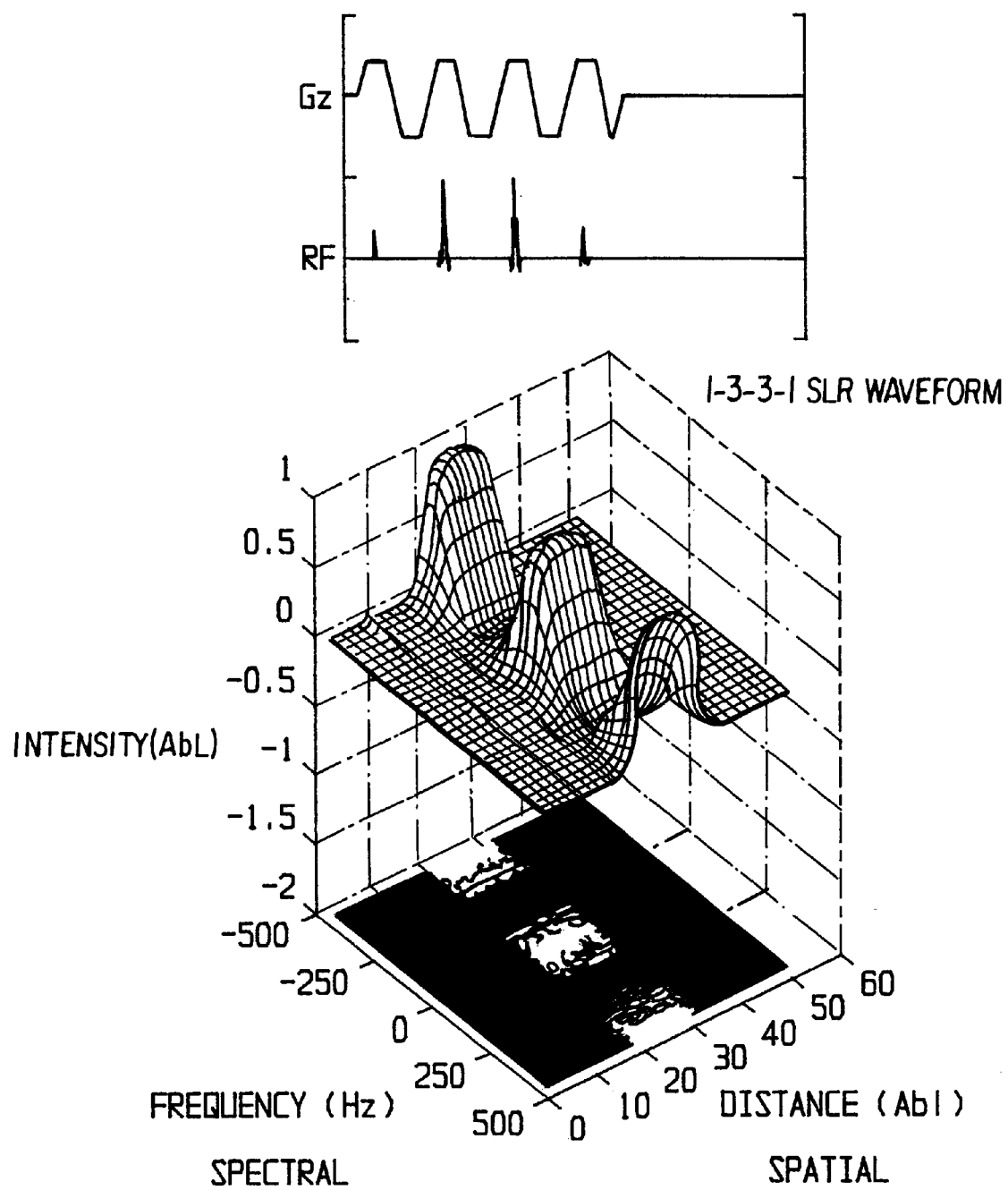
FIG. 4( a )

SYSTEM AND METHOD FOR THREE-DIMENSIONAL INTERLEAVED WATER AND FAT IMAGE ACQUISITION WITH CHEMICAL-SHIFT CORRECTION

REFERENCE TO RELATED APPLICATION

The present application claims the benefit of U.S. Provisional Application No. 60/135,212, filed May 21, 1999, whose disclosure is hereby incorporated by reference in its entirety into the present disclosure.

BACKGROUND OF THE INVENTION

Proton ($^1$H) Magnetic Resonance Imaging (MRI) works by imaging protons in the object and more specifically provides a representation of the specific chemical environment of the imaged protons. The information from the chemical environment of the protons can be acquired in many different ways. The protons are excited, and the information is acquired, by use of an electromagnetic pulse sequence.

The pulse sequence is designed to acquire specific information from specific chemical species containing proton nuclei. The most useful species in practice are fat and water. Therefore, several pulse sequences have been developed to acquire and display information only from water-containing tissues or only from fat-containing tissues. The resulting images are called chemical shift images. Other pulse sequences acquire data from both water- and fat containing tissues. The water-only images have widespread use in the clinical environment due to their ability to highlight the pathology in organs and structures without the interference from fat signal. On the other hand, water-plus-fat images are required for anatomic details.

So far, water-only and water-plus-fat images are normally acquired using two different imaging sequences. The increasing pressure in clinical practice to increase throughput, however, seldom allows the acquisition of multiple sequences, thus increasing the pressure to develop pulse sequences that will improve the ratio of information provided to imaging time used. This can be done either by decreasing the imaging time per sequence or increasing the information provided per sequence.

Several techniques have been developed to acquire water-only or fat-only images. In chemical saturation technique an additional long spectrally selective RF pre-saturation pulse is applied before the RF excitation pulse to suppress the signal of the undesired chemical species.

The chemical saturation technique is explained by Harms S E, Flaming D P, Hesley K L, et al. MR imaging of the breast with rotating delivery of excitation off resonance: clinical experience with pathologic correlation (Radiology 1993; 187:493–501); Haase A, Frahm J. Multiple chemical shift selective NMR imaging using stimulated echoes (J Magn Reson 1985; 64:94–102); Pauly J M, Nishimura G G, Macovski A, Multidimensional selective excitation (Proc Soc Magn Reson Med 1988; 7:654); Joseph, P M, A spin echo chemical shift MR imaging technique (J Comput Assist Tomogr 1985; 9:651–658); and Dumoulin C L, A method for chemical-shift-selective imaging (Magn Reson Med 1985; 2:583–585).

This technique, however, is sensitive to $B_0$ and $B_1$ inhomogeneities, and it also either increases the TR time or reduces the number of imaging slices. Another method for spectral selective imaging, which is gaining increased interest, is the three-point Dixon method.

The Dixon method is described by Glover G and Schneider E, Three-point Dixon technique for true fat/water decomposition with $B_0$ inhomogeneity correction (Magn Reson Med 1991; 18:371–383); Totterman S, Weiss S L, Szumowski J, Katzberg R W, Hornak J P, Proskin H M, Eisen J, MR fat suppression technique in the evaluation of normal structures of the knee (Comput Assist Tomogr 1989 May–Jun; 13(3):473–9); Wang Y, Li D B, Haacke E M, Brown J J, A three-point Dixon method for water and fat separation using 2D and 3D gradient-echo (J Magn Reson Imaging 1998; 8(3): 703–710); Xiang Q S, An L, Water-fat imaging with direct phase encoding (J Magn Reson Imaging 1997; 7(6): 1002–1015); and Ma J, Wehrli F W, Song H K, Hwang S N, A single-scan imaging technique for measurement of the relative concentrations of fat and water protons and their transverse relaxation times (J Magn Reson 1997; 125(1): 92–101).

Although it provides water-only and fat-only images simultaneously and reduces the $B_0$ inhomogeneity problem, the three-point Dixon method also has drawbacks. It increases imaging time, and limits the TE to specific values.

Water and fat images have also been obtained using spatial-spectral excitation, which is described by Schick F, Foster J, Machann J, Huppert P, and Claussen C, Highly selective water and fat imaging applying multislice sequences without sensitivity to $B_1$ inhomogeneities (Magn Reson Med 1997; 38:269–274); Meyer C H, Pauly J M, Macovski A, Nishimura D G, Simultaneous Spatial and Spectral Selective Excitation (Magn Reson Med 1990; 15:287–304); Block W, Pauly J, Kerr A, Nishimura D, Consistent fat suppression with compensated spectral-spatial pulses (Magn Reson Med 1997; 38:196–206); Schick F, Simultaneous highly selective MR water and fat imaging using a simple new type of spectral-spatial excitation (Magn Reson Med 1998; 40:194–202); and Hardy P A, Recht M P, Piraino D W, Fat suppressed MRI of articular cartilage with a spatial-spectral excitation pulse (J Magn Reson Imaging 1998; 8:1279–1287).

In early studies, sinusoidally oscillating gradients and frequency-modulated RF pulses were used to obtain two-dimensional (2D) water and fat images, as described by Meyer, C H et al (cited above) and Spielman D, Meyer C, Macovski A, Enzmann D, $^1$H spectroscopic imaging using a spectral-spatial excitation pulse (Magn Reson Med 1991; 18:269–279).

With recent technology development, higher gradient amplitude and faster gradient switching rate has allowed the development of simpler and more efficient spatial-spectral excitations, as described by Shick et al, Block et al, and Hardy et (cited above) and by Thomasson D, Purdy D, Finn J P, Phase-modulated binomial RF pulses for fast spectrally-selective musculoskeletal imaging (Magn Reson Med 1996; 35:563–568).

Spatial-spectral excitations were implemented on 2D spin echo sequences to provide multi-slice imaging and on 3D gradient echo sequences (Shicik et al, Hardy et al, Thomasson et al). In the imaging of the knee, they provide better fat suppression than the conventional pre-saturation technique. However, this approach does not allow simultaneous acquisition of both water and fat images. In an effort to improve the ratio between information provided and imaging time used, simultaneous water and fat imaging techniques were developed to acquire water and fat data in alternate phase encoding line (Meyer et al, Schick et al). So far, the existing literature reports their implementation on 2D imaging only. 3D MRI allows the use of higher spatial resolution and also has a higher SNR. However, it requires longer acquisition time.

SUMMARY OF THE INVENTION

It will be readily apparent from the foregoing that a need exists in the art to be able to take and provide water-only, fat-only, and combined water-and-fat MR images rapidly and efficiently, without chemical shift artifacts or interference from other chemical species.

It is therefore a primary object of the present invention to acquire water-only and fat-only images during 3D image acquisition.

It is another object of the present invention to produce combined water-and-fat images from the acquired water-only and fat-only images.

It is another object of the present invention to produce combined water-and-fat images without chemical shift artifacts.

It is yet another object of the present invention to acquire water-only and fat-only images without interference from other chemical species.

To achieve the above and other objects, the present invention is directed to a system and method in which a pulse sequence contains alternating phase-encoding lines for the excitation of water and of fat within one data acquisition time. The pulse sequence provides water-only and fat-only images without interference from the other chemical species. It acquires and produces water-only and fat-only images during the same data acquisition time. It also produces 3-D water plus fat images with perfect local registration, eliminating the chemical shift artifact in both in-plane and through-plane directions, which none of the other sequences has been able to provide so far.

We designed and implemented a pulse sequence to simultaneously acquire water and fat 3D images in a single acquisition time, referred as three-dimensional interleaved water and fat image acquisition with chemical-shift correction (3-DIWFAC), for a 1.5 Tesla clinical MR scanner. In addition, since for clinical diagnosis, fat-suppressed and non-fat-suppressed images rather than water-only and fat-only images are used, we developed an algorithm to combine the water and fat images to produce water-plus-fat images. Furthermore, the algorithm was written in such a way that chemical-shift artifacts were removed.

The present invention makes use of spatial-spectral excitation to acquire water and fat 3D images simultaneously using the imaging time of a regular single acquisition. In addition, the water and fat images are combined to produce water-fat combined images free of chemical-shift artifact.

BRIEF DESCRIPTION OF THE DRAWING FIGURES

A preferred embodiment of the present invention will be set forth in detail with reference to the drawings, in which:

FIGS. 4a and 4b are graphical views of spatial-spectral profiles;

DETAILED DESCRIPTION OF THE PREFERRED EMBODIMENT

Figure 1:
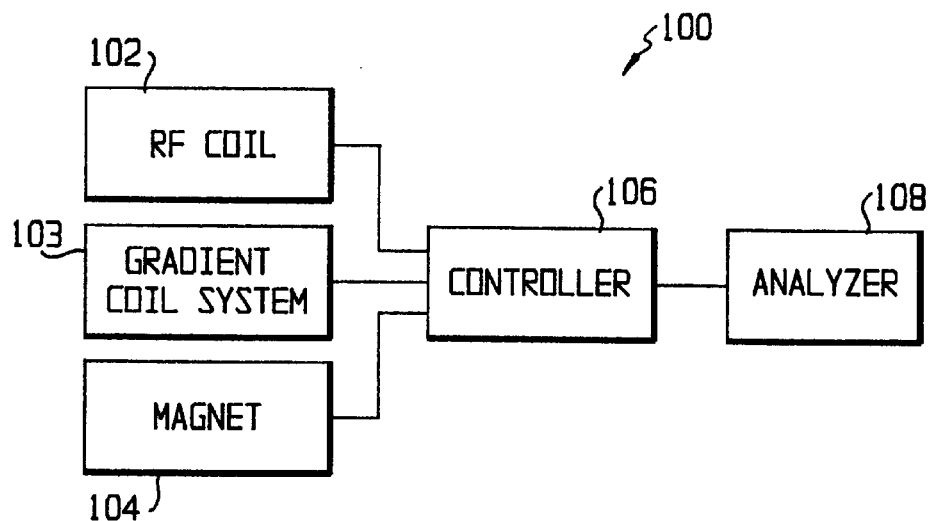
FIG. 1 is a block diagram showing an overview of a system on which the preferred embodiment can be implemented.

A preferred embodiment of the present invention will now be set forth in detail with reference to the drawings, in which like reference numerals refer to like components throughout.

FIG. 1 shows an overview of a system 100 on which the preferred embodiment can be implemented. An RF coil 102, a gradient coil system 103, and a magnet 104 supply the fields used in imaging under the control of a controller 106. An analyzer 108 such as an SGI workstation analyzes and processes the data to form an image. While the system 100 can be implemented on any suitable equipment, it has been tested on a SIGNA (Horizon 5.7) 1.5T MR scanner (General Electric Medical Systems, Milwaukee, Wis. U.S.A.) with maximum gradient strength of 23 mT/m and maximum gradient switched rate of 120 mT/m/ms. The analyzer 108 can be any sufficiently powerful workstation.

Figure 2:
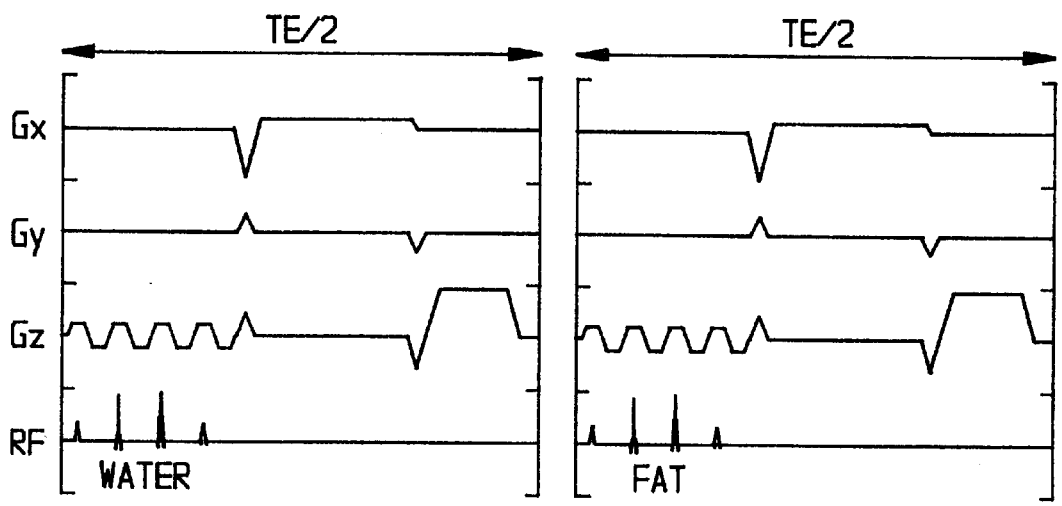
FIG. 2 is a waveform diagram of an imaging pulse sequence according to the preferred embodiment, a pulse sequence diagram of the 3-DIWFAC sequence.

The system 100 generates a pulse sequence such as that shown in FIG. 2, in which Gx, Gy, and Gz represent the magnetic field gradients in the x, y, and z directions, respectively, while RF represents the transmitted RF signal.

The standard General Electric (GE) 3D gradient echo (GRE) pulse sequence was modified for spatial-spectral selective excitation using binomial composite Shinnar-Le Roux (SLR) sub-pulses, as explained by V. Sklenar and Z. Starcuk in "Pulse train: a new effective method of selective excitation for proton NMR in water" (J. Mag. Reson. 1982; 50:495–501), and by J. Pauly, P. Le Roux, D. Nishimura, and A Macovski in "Parameter relations for the Shinnar-Le Roux selective excitation pulse design algorithm" (IEEE Trans. Med. Imaging 1991; 10:53–65), the contents of which are entirely incorporated herein by reference.

To avoid alias artifacts from signal outside the selected imaging slab, we used a SLR waveform in the binomial sub-pulses instead of the conventional sinc-modulated waveform. SLR waveform provides a more rectangular spatial selective profile that is required by 3D imaging. The SLR sub-pulse was designed using "EPIC Tool" provided by GEMS. A linear phase small-tip-angle SLR pulse was generated with a 600 $\mu$s pulse duration, 12 kHz bandwidth, 0.5% pass-band ripple and 1% stop-band ripple. The resultant RF pulse consisted of two wave cycles. The separation between successive SLR sub-pulses was 2.3 ms, creating frequency selective and null regions separated by 217 Hz. This corresponds to the difference in water and fat resonance frequencies of 3.35 ppm at 1.5 T. During image acquisition, the phase-encoding phase-encoding lines in the slice direction were interlaced with alternating water and fat frequency excitation.

A diagram for the pulse sequence is shown in FIG. 2. The duration between neighboring water and fat excitation RF pulses was set as half the repetition time (TR). After imaging, the raw data were transferred to a remote workstation (analyzer 108) for image reconstruction. A reconstruction program was developed with MATLAB (MathWorks Inc, Natick, Mass.) in which alternate phase-encoding lines were sorted out to reconstruct water-only and fat-only magnitude images. They were then re-aligned in the frequency encoding direction, and combined to form water-fat images.

To determine the most suitable spatial-spectral binomial excitation for the purpose described above, several different designs were experimentally evaluated. The performance of 1-2-1, 1-3-3-1, and 1-4-6-4-1 binomial sequences, as well as that of the excitation pulse used in the regular echo-planar imaging (EPI) sequence provided by the manufacturer, were evaluated and compared. To obtain the spatial and spectral profiles of those excitations, a 2D GRE sequence that incorporated those spatial-spectral excitations in the readout direction was developed. By imaging a rectangular shaped phantom filled with a homogeneous solution of copper sulfate, the spatial profile of each binomial excitation sequence was obtained from the image projection in the readout direction. The spectral profile was then obtained by repeating the scan with the carrier frequency shifted in 25 Hz steps from −450 Hz to 450 Hz around the resonance frequency for water.

Based on the results of those experiments, it was determined that the 1-3-3-1 binomial sequence was the most suitable excitation design since it gave the best overall performance in spatial profile, spectral profile and excitation pulse width, and it was incorporated into the 3-DIWFAC sequence.

Figure 10:
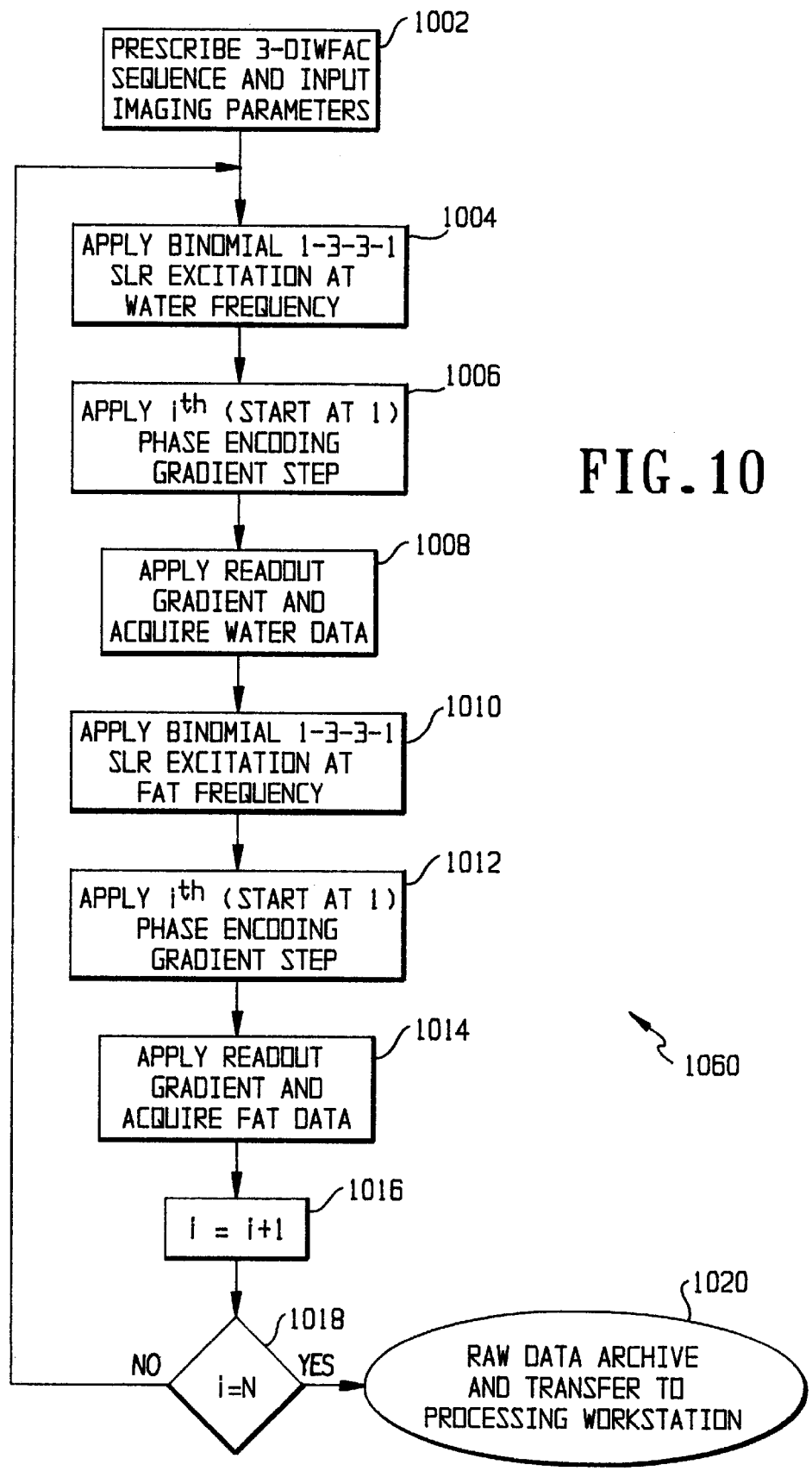
FIG. 10 is a flow chart showing the steps for acquiring raw data using tn e pulse sequence of FIG. 2.
Figure 11:
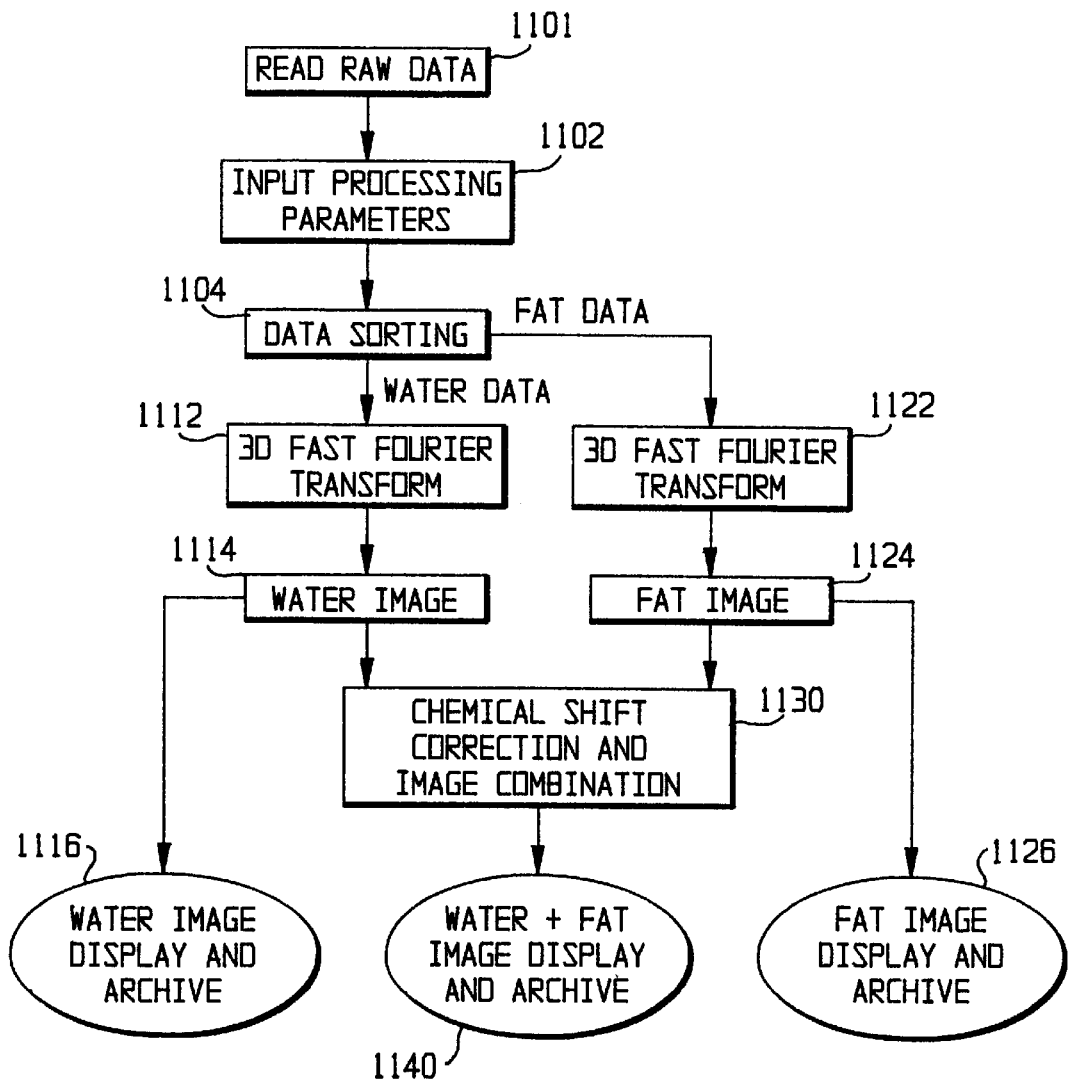
FIG. 11 is a flow chart showing the MATLAB codes for processing the raw data.

FIGS. 10–11 show the preferred steps implementing the present invention.

FIG. 10 shows a program 1060 to run in the controller 106 of FIG. 1. It begins with step 1002, in which the imaging parameters for the 3-DIWFAC sequence are prescribed. They are: repetition time (TR), echo time (TE), RF flip angle, field of view (FOV), slice thickness, matrix size in the frequency encoding direction, matrix size in the phase encoding direction (total number of phase encoding steps), imaged slice orientation, slice position, receiver bandwidth and averaging number. They are prescribed by manual entry on the MR scanner console, before scanning.

The program 1060 includes a programming loop comprising steps 1004–1016. That loop is a phase encoding loop which repeats N times (each pass through the loop is one phase-encoding step). The loop is counted by incrementing a counter i, from 1 to N. The phase encoding (or phase encode) procedure in the loop requires multiple repetitions of the imaging pulse sequence, with the application in each of the steps of a different phase encoding gradient strength. The steps 1004–1016 of the loop comprise the application of a different phase encoding gradient strength on each pass through the loop and also the application of the particular phase encode gradient strength for each of the chemical species (water and fat). Therefore, a given phase encode gradient strength is applied twice at each phase encoding step (in each pass through the loop), once at each of the two frequencies. The loop terminates after data is acquired at the fat frequency.

The counter i corresponds to a particular value of the phase encoding. The gradient strength (millitesla/meter) is increased or decreased, preferably by a fixed increment or decrement, when the counter i is incremented.

In other words, the sequence of steps inside the loop includes alternating excitation and acquisition at water and fat frequencies, which generates the alternating phase-encoding lines for the if phase encoding step, i.e., the $i^{th}$ pass through the loop 1004–1016. (The invention also contemplates three chemical species and three frequencies in each pass through the loop 1004–1016, four species and four frequencies, etc.)

The loop sequence illustrates forming a pulse sequence. A separate phase-encoding line is created for each chemical species at each phase encoding step; that is, steps 1004–1008 create one phase-encoding line (for water) and steps 1010–1014 create another phase-encoding line (for fat). Therefore there are two phase-encoding lines for each phase encoding step (loop pass), one for water and the other for fat. The total number of phase-encoding lines in the raw data thus equals two times the number of phase encoding steps. The water data are in the odd lines and the fat data are in the even lines of the raw data set, due to the water data being taken first; this optionally may be reversed.

The decision box 1018 tests the incremented counter i.

The workstation mentioned inside the oval of step 1020 is preferably the analyzer 108 of FIG. 1. It is used to perform the program 1080 shown in FIG. 11, which operates on the raw data transferred from the program 1060 of FIG. 10. The raw data are input at step 1101.

Then, at step 1102, the process parameters are input into the program 1100. Those preferably include: image matrix dimensions, number of imaging slices, number of RF coil elements, and the in-plane chemical shift direction (determined by the polarity of the frequency-encoding gradient). They can be input manually through a graphical user interface or retrieved automatically from the header information in the data file.

The next step, 1104, represents sorting of fat and water data. That step 1104 is performed automatically by the program and separates the portions of the signal corresponding to fat and water. In a sense, this data sorting step 1104 undoes the interleaved pattern of water-frequency/fat-frequency from steps 1104–1014 in program 1000. It is the same as undoing the alternating pattern of phase-encoding lines.

The 3-D fast Fourier transform used in steps 1112 and 1122 uses a standard fast Fourier algorithm. The inputs in each of those steps (on left and right in FIG. 11) are the water, or the fat, 3-D real and imaginary raw data; the outputs are the corresponding 3-D real (R) and imaginary (I) images. Those two image sets are then combined and transformed to form respective "magnitude" (M) images using the equation $$M=[R^2+I^2]^{(1/2)}$$

There are two types of chemical shift artifacts. One is in the in-plane direction and the other in the through-plane (or slice) direction. The through-plane artifacts are not present in the 3-DIWFAC images due to the intrinsic nature of the 3-DIWFAC sequence, in which each chemical species is excited at its own frequency. The in-plane artifacts are removed by shifting the fat images with respect to the water images in the frequency encoding (readout) direction by an amount determined by the receiver bandwidth. No artifacts are created by the signal processing.

A correction is made in step 1130, in order to correct for the in-plane chemical shift artifacts. These artifacts are present and identical in both the regular GRE sequence and the 3-DIWFAC sequence. However, the in-plane chemical-shift artifacts can be corrected in the 3-DIWFAC sequence but not in the regular GRE sequence. The reason is as follows. In the 3-DIWFAC sequence, the raw datw is separated in water-only and fat-only components. These components are then reconstructed into water images and fat images that can be re-aligned to correct for the chemical-shift artifacts. However, in the regular GRE sequence, water and fat signals are acquired together and cannot be separated from each other for chemical-shift correction. The 3-DIWFAC sequence also eliminates the through-plane shift artifacts since each chemical species is excited at its own frequency.

For each imaging slice, the magnitude image of fat is shifted with respect to the water magnitude image by an amount corresponding to the in-plane chemical-shift in the frequency-encoding direction. The water and fat magnitude images are then added together to form the water-plus-fat image. That image combination is novel to the present invention.

Phantom Study

The imaging properties of the new sequence were tested using a phantom that consisted of acetone and saline solution in two separate glass bottles. Acetone was used since it contained only a single spectral peak at the Larmor frequency similar to that of fat ($-CH_2-$), and did not contain spectral components that overlapped with or near the water frequency. This allowed us to perform a quantitative evaluation. The phantom was imaged with the 3-DIWFAC sequence using TR of 56 ms, TE of 15 ms, flip angle of 20°, and FOV of 24 cm. To compare the images with those acquired with conventional imaging sequences, the phantom was imaged with the regular 3D GRE sequence using the same imaging parameters. To evaluate the amount of cross-talk between the water and fat excitation, a modified version of the 3-DIWFAC sequence was also programmed in which only either the water or fat was excited. Then the phantom was imaged twice using this modified sequence to obtain either the water-only or fat-only images each time. The raw data of the 3-DIWFAC, modified 3-DIWFAC, and 3D GRE sequences were reconstructed using the program that we developed. The SNR of water and fat as well as the contrast ratio between the species in the images obtained with the above sequences were then measured and compared.

In-vivo Study

In-vivo imaging tests of the 3-DIWFAC sequence were conducted by imaging the knees, wrists, heads, and pelvis of three normal volunteers. The imaging parameters were chosen to be similar to those used routinely in the clinical practice. The knees were scanned with TR=56 ms, TE=15 ms, flip angle=25°, FOV=12 cm, slice thickness=1.5 mm, matrix size of 256×128, readout bandwidth of ±15.625 kHz, 64 slices and imaging time of 8 minutes. The same imaging parameters were used to acquire the regular 3D GRE images with and without fat suppression for comparison. The wrist images were obtained using similar parameters but with 8 cm FOV and 32 slices in 4 minutes. Both the knee and wrist images were acquired using phased array receiver coils specifically designed for the imaged joint. The knee coil consisted of a four-coil array, while the wrist coil was composed of an orthogonal dual coil array. In the head study, a regular GE transmit-receive head coil was used with similar imaging parameters but with FOV of 24 cm and 64 image slices. To image the pelvis, the GE body coil was used with TR=56 ms, TE=11 ms, flip angle=20°, FOV of 36 cm, 4 mm slice, and 32 slices. The raw data was first reconstructed into water-only and fat-only images. Before the fat images were combined with the water images, they were shifted by two pixels in the increased readout frequency direction since the receive bandwidth used corresponded to 122 Hz per pixel. That approach was used to remove the chemical shift artifacts. To evaluate the effect of removal of the chemical shift artifact on reduced receive bandwidth imaging, additional images were acquired on the knee using a receive bandwidth of ±10.42 kHz. For those experiments, the fat images were shifted by 3 pixels before being combined with the water images.

Results of Phantom Study: Pulse Sequence Design

Figure 3:
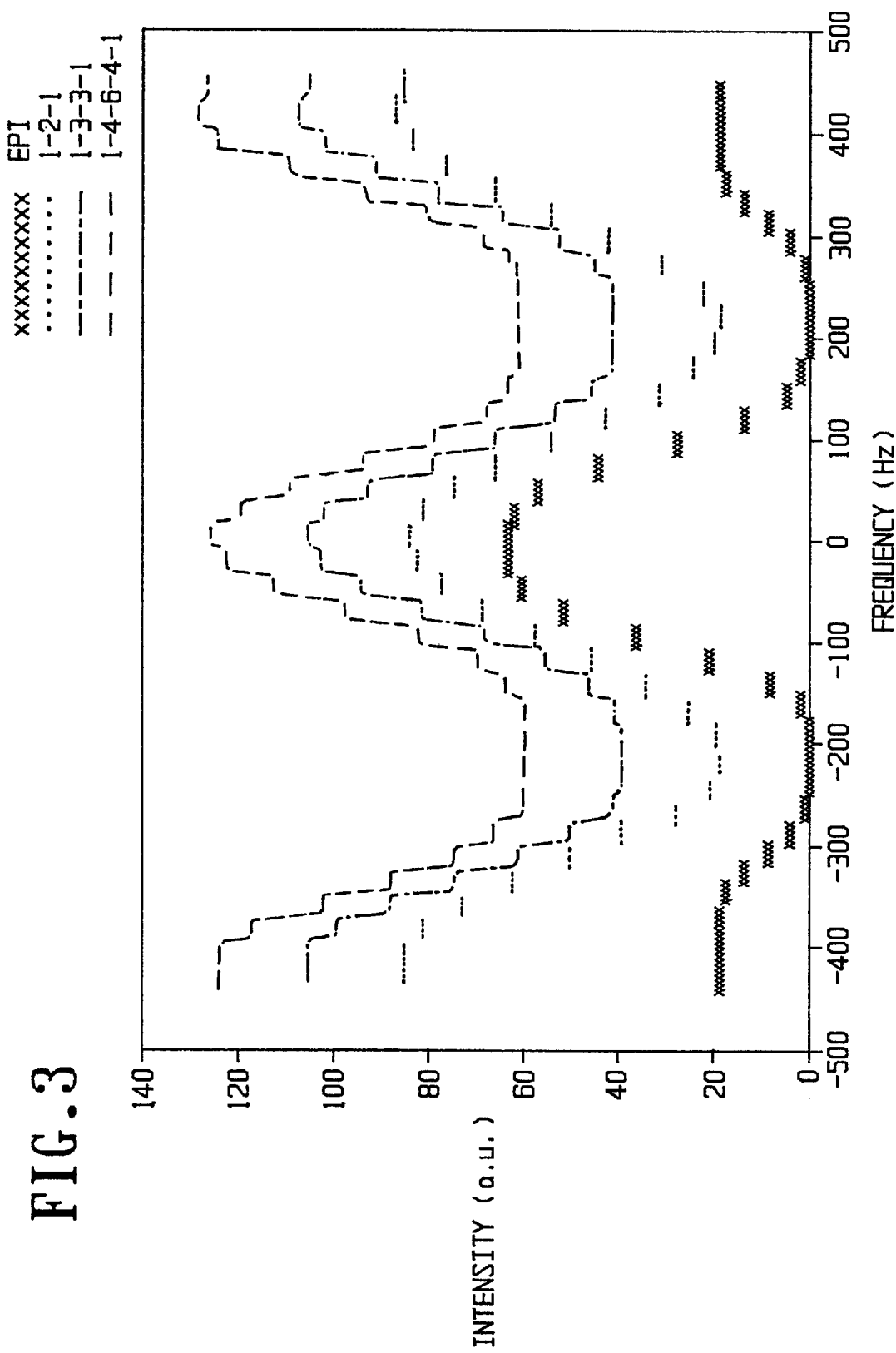
FIG. 3 is a graph of a spatial-spectral profile achieved by the preferred embodiment.

In the excitation profile study on the copper sulfate solution phantom, comparison of the various spectral profiles showed that all four spatial-spectral excitations gave comparable spectral selectivity, but the 1-4-6-4-1 composite had the broadest null region (which is most effective in suppressing the undesired chemical species) while the 1-2-1 composite had the narrowest null region (FIG. 3). The 1-3-3-1 composite had a similar profile compared to that of the first central lobe of the scanner's EPI sequence. Since a broader null region provides better suppression of the undesired chemical species in an inhomogeneous $B_0$ field, the 1-4-6-4-1 composite possessed the most favorable spectral profile, followed by the 1-3-3-1 composite.

Figure 4B:
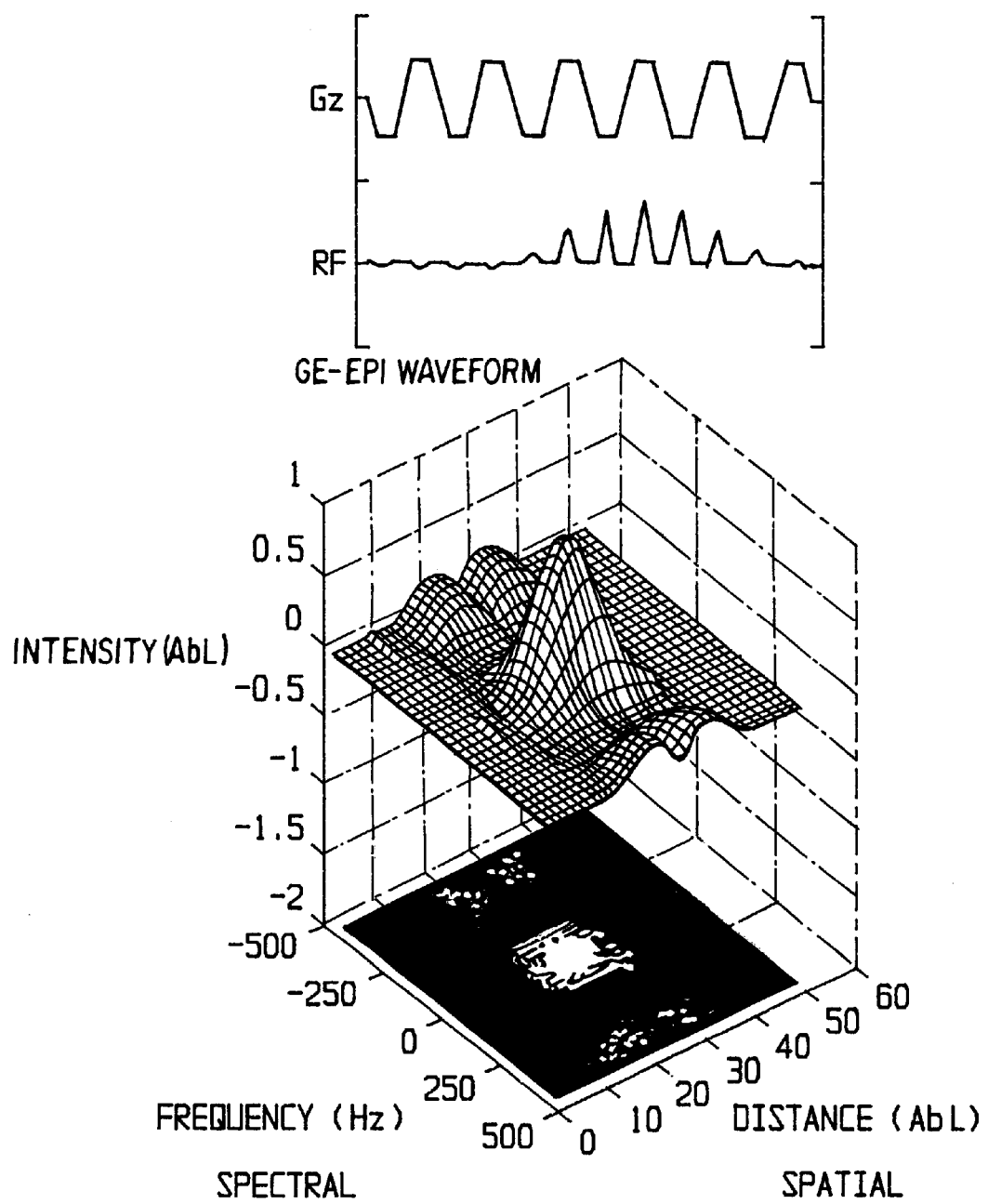

The spatial profiles of the 1-2-1, 1-3-3-1 and 1-4-6-4-1 binomial SLR pul similar, and contained sharp slab boundaries needed to minimize alias artifacts from signal outside the selected 3D slab (FIGS. 4a and 4b).

FIG. 4a shows the spatial-spectral profile of the 1-3-3-1 excitation and FIG. 4b shows the spatial-spectral profile of the regular EPI excitation. The 1-3-3-1 excitation has a shorter pulse length (8 ms) as compared to the EPI excitation pulse (14.4 ms), allowing a shorter minimum TE. The 1-3-3-1 SLR excitation also has a more rectangular spatial profile that is necessary for 3-D imaging to avoid alias artifacts in imaging slices near the 3-D slab boundaries. Its spectral profile is comparable to that of the EPI excitation in the central lobe.

The profile of the regular 3D GRE sequence had slightly smoother edges. On the other hand, the scanner's EPI sequence excitation had a smooth profile significantly deviated from the desired rectangular shape, making it unacceptable for use in 3D imaging.

Another criterion for the optimal binomial excitation pulse was the pulse duration, since it affected the minimum TE and TR values of the new 3D GRE sequence. Of the three SLR binomial pulses, 1-4-6-4-1 had the longest pulse duration (Table 1), and therefore it was not used.

With consideration of all three factors, the 1-3-3-1 composite excitation was chosen for its reasonable spatial and spectral profile, and its duration within requirement for minimum TE. It was incorporated into the 3-DIWFAC sequence.

Results of Phantom Studies

In the saline and acetone phantom imaging study, the three sequences tested gave similar SNRs for saline as well as for acetone (Table 2). Similar results from the 3-DIWFAC sequence and its modified version in which only either saline or fat was excited demonstrated that the high spectral selectivity of the excitation pulse in the 3-DIWFAC sequence effectively minimized the cross-talk between the alternating water and fat excitation. Compared with the results of the regular GRE sequence, the 3-DIWFAC water-only and fat-only images have similar SNRs as that of the fat-suppressed and water-suppressed GRE image in the central slice of the imaging slab. The SNR of the 3-DIWFAC water-plus-fat image is lower than that of the non-fat-suppressed GRE image by a factor of $\sqrt{2}$ due to the summation of noise from both the water-only and fat-only images. However, if the background noise of the water-only and fat-only images is removed by setting an intensity threshold just above the noise level before image combination, then the water-plus-fat image has a similar SNR as the non-fat-suppressed GRE image. The similar SNRs and image contrast as the GRE sequence indicated correct implementation and calibration of the 3-DIWFAC sequence. In addition, the intensity ratios between the selected and non-selected species in the water-only and fat-only images are higher with the 3-DIWFAC sequence, indicating a superior spectral selectivity than the regular chemical saturation technique used in the regular 3D GRE sequence.

Results: In-vivo Studies

When the water-fat combined images of the volunteer studies were compared to those of the 3D GRE images, the image contrast of anatomic structures was similar (FIG. 5–8).

Figure 5A:
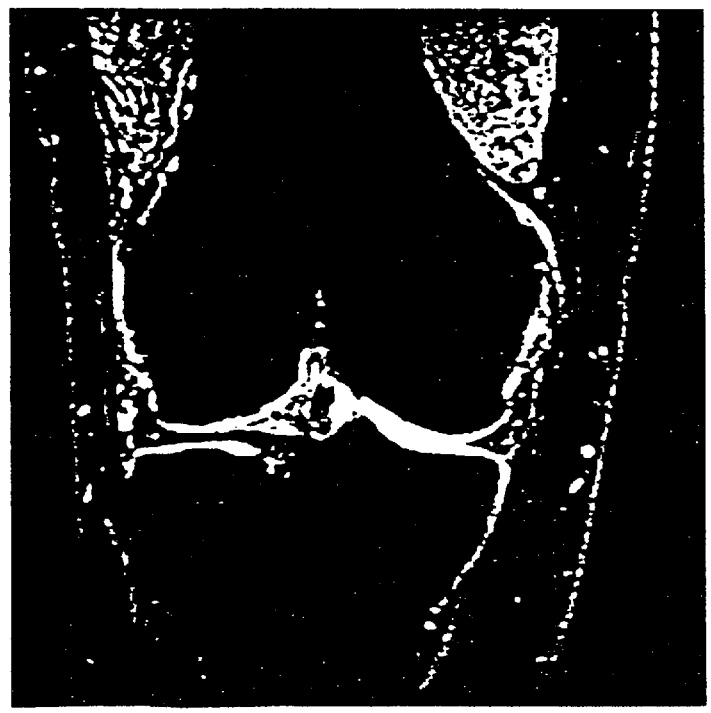
FIGS. 5a–5d are images of a knee taken by the preferred embodiment.
Figure 5B:
Figure 5C:
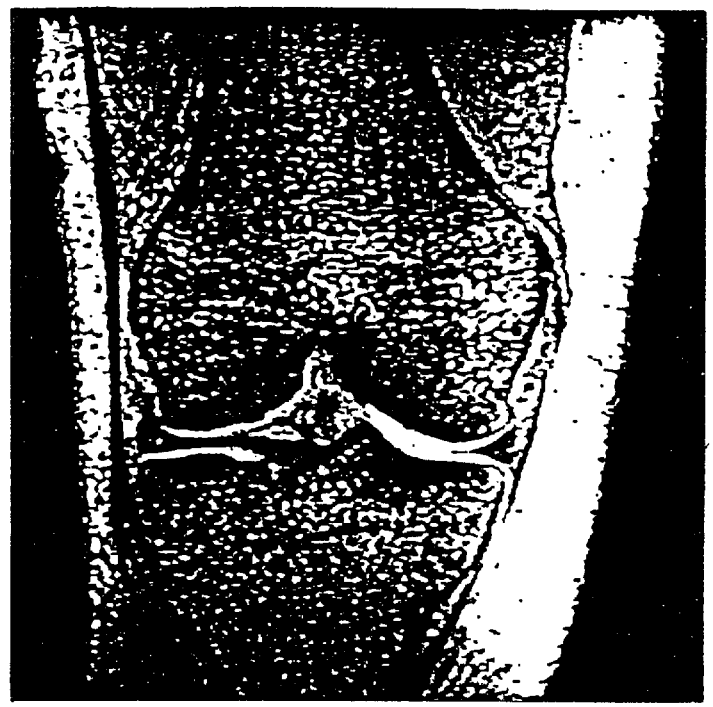
Figure 5D:
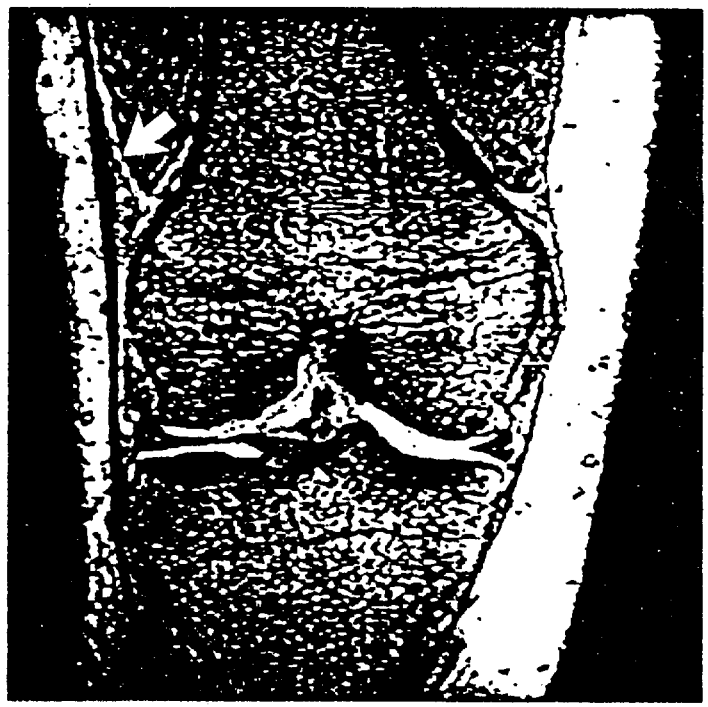

FIGS. 5a–5c shows 3-DIWFAC images, and FIG. 5d shows a GRE image of, a knee. The water image (FIG. 5a) shows, in the bone marrow, absence of fat signal, and the fat image of FIG. 5b shows good suppression of the muscle signal. FIG. 5c is a 3-DIWFAC water-plus-fat-image with chemical shift correction. It removes the artifacts seen at the water-fat boundaries of the GRE image of FIG. 5d (indicated by the arrow in FIG. 5D).

In addition, vascular structures perpendicular to the imaging plane did not show up dark as in the regular GRE sequence due to the flow compensating nature of the excitation gradient pulses in the new sequence. Compared with the regular fat-saturated GRE images, the water-only images of the 3-DIWFAC sequence showed better fat suppression, as demonstrated, e.g., in the peripheral regions of the pelvis (FIG. 7).

FIGS. 7a–7d are pelvis images acquired with 3-DIWFAC (7a and 7c) and regular 3-D GRE sequence (7b, 7d). The 3-DIWFAC water image (7a) shows a better suppression in the peripheral fat regions than the regular fat-suppressed GRE image (7b). With chemical shift correction, the 3-DIWFAC water-plus-fat image (7c) eliminates the artifacts at the water-fat boundaries in the GRE image (7d), and gives a more uniform appearance.

Figure 8A:
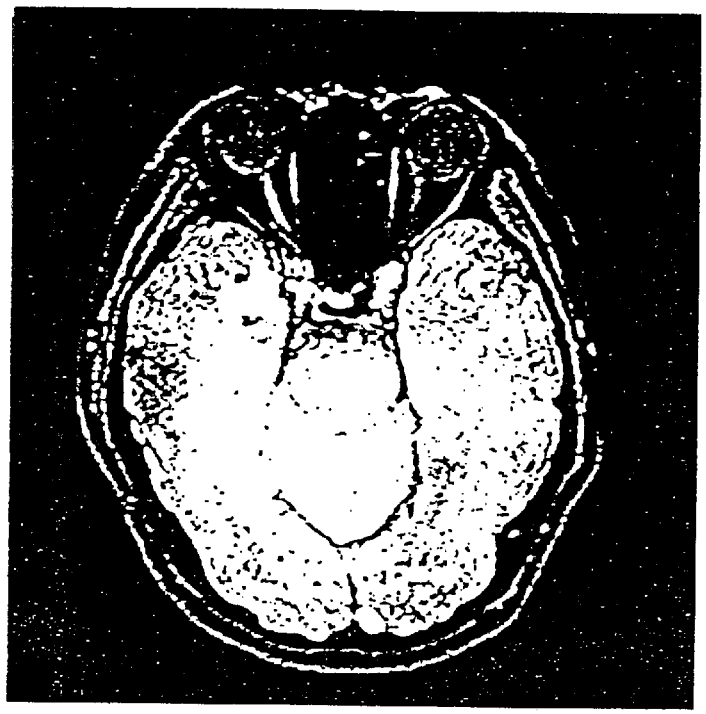
FIGS. 8a–8d are images of a head taken by the preferred embodiment.
Figure 8B:
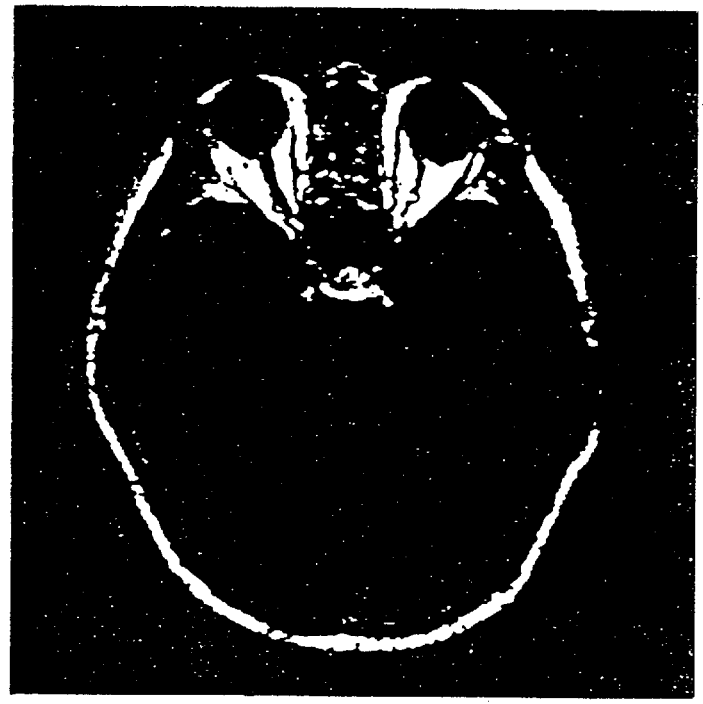
Figure 8C:
Figure 8D:
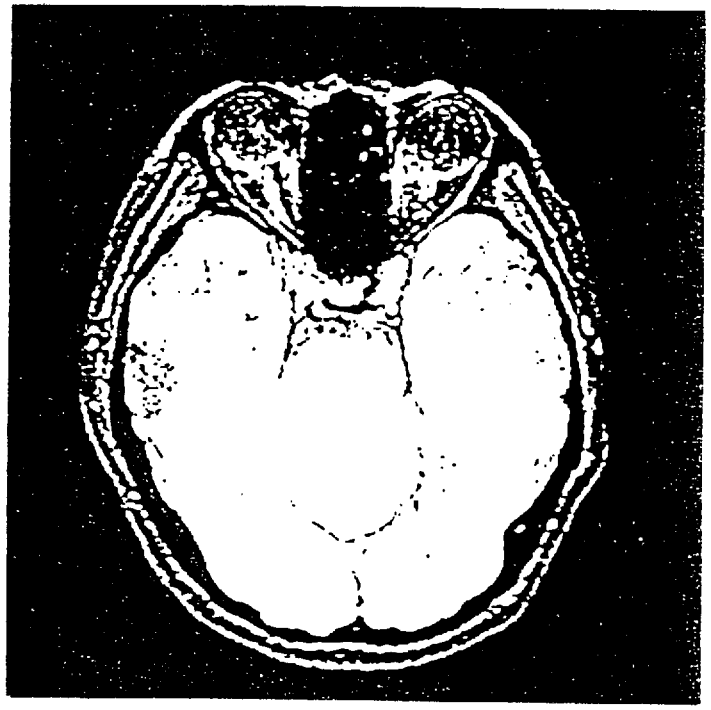

In the head study, the 3-DIWFAC sequence provided good water and fat separated images. FIG. 8a is a water image, and 8b a fat image, from the 3-DIWFAC sequence. They show good water and fat separation in the brain and in the optical nerve, even near the sinus area where there are relatively large magnetic field susceptibility variations. The chemical-shift artifact-corrected water-plus-fat image (8c) more accurately shows the orbits and scalp as compared with the uncorrected image (8d)

The good water and fat selectivity in the wrist images demonstrates that the new sequence can be used to image small body parts using local phased array receive coils despite rapid susceptibility variations among small tissue structures (FIGS. 6a–6d).

Figure 6A:
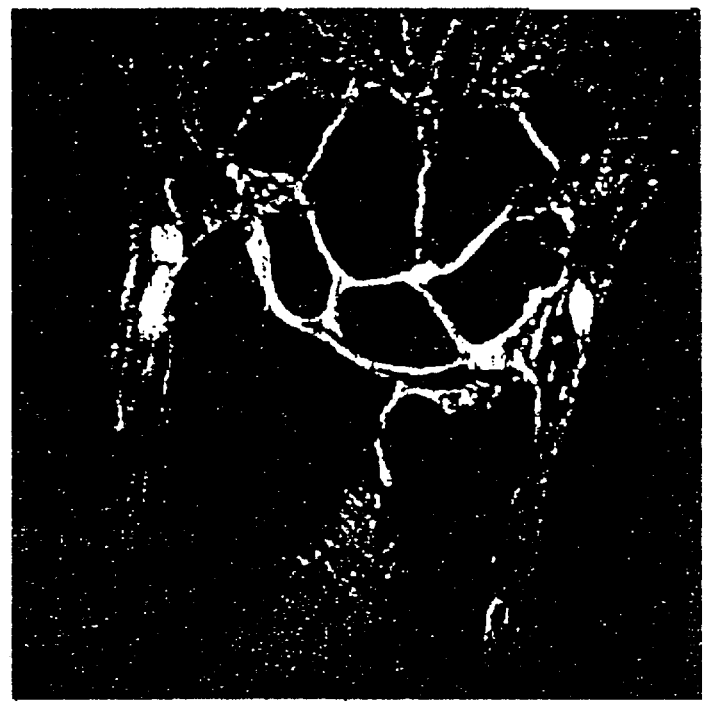
FIGS. 6a–6d are images of a wrist taken by the preferred embodiment.
Figure 6B:
Figure 6C:
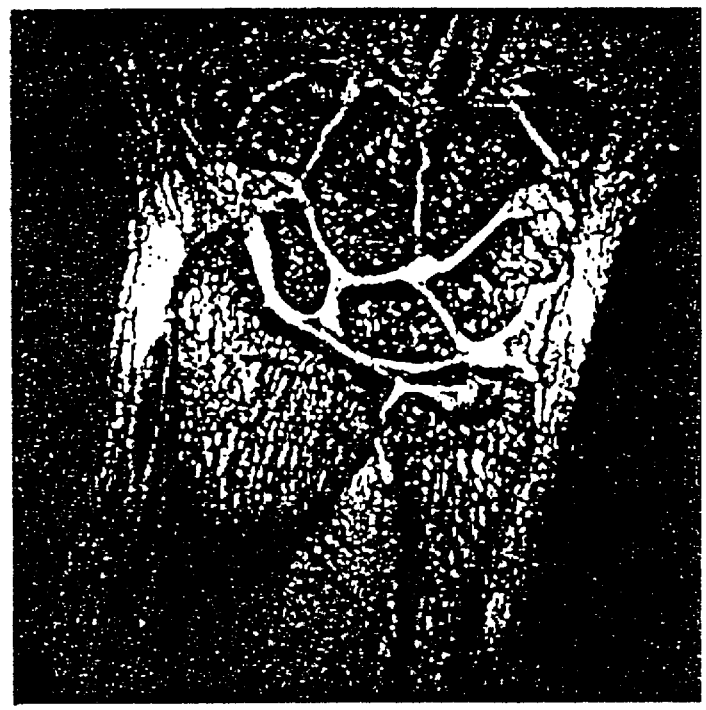
Figure 6D:
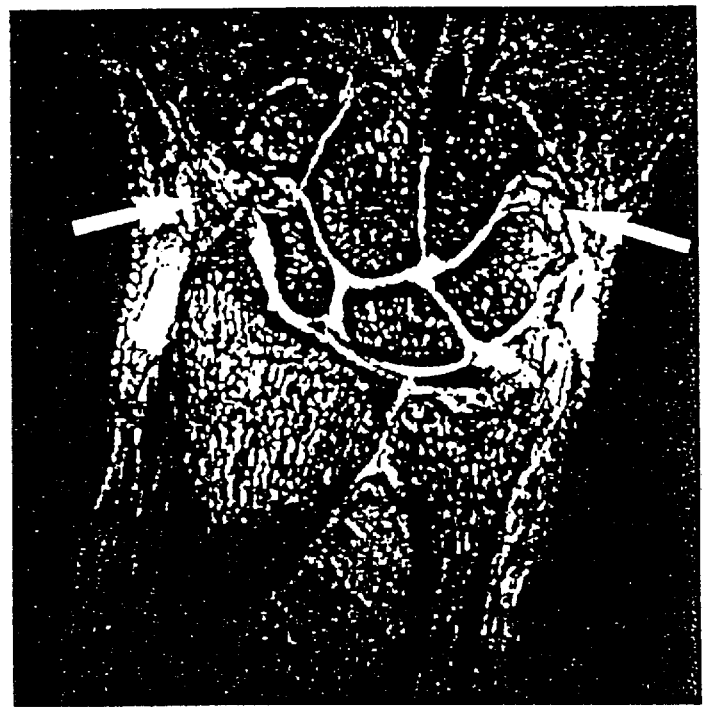
Figure 7A:
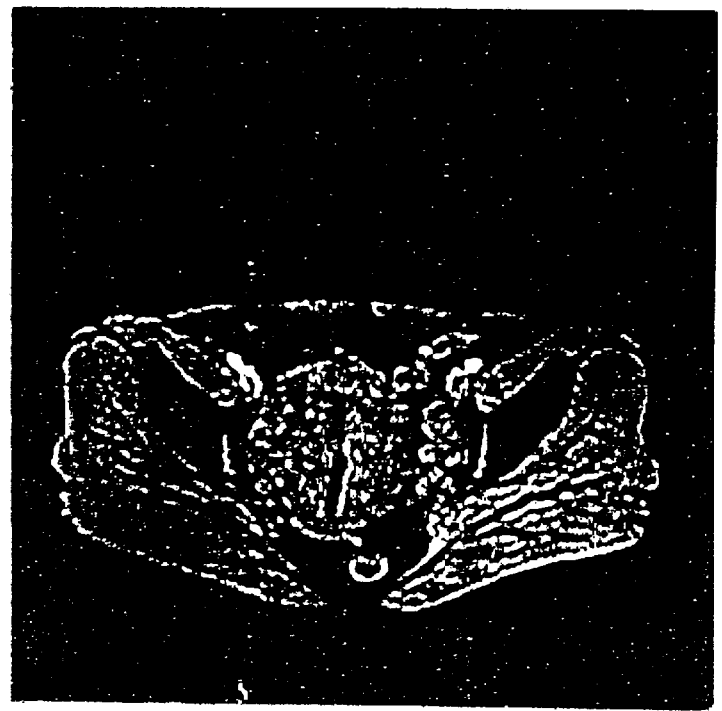
FIGS. 7a–7d are images of a pelvis taken by the preferred embodiment.
Figure 7B:
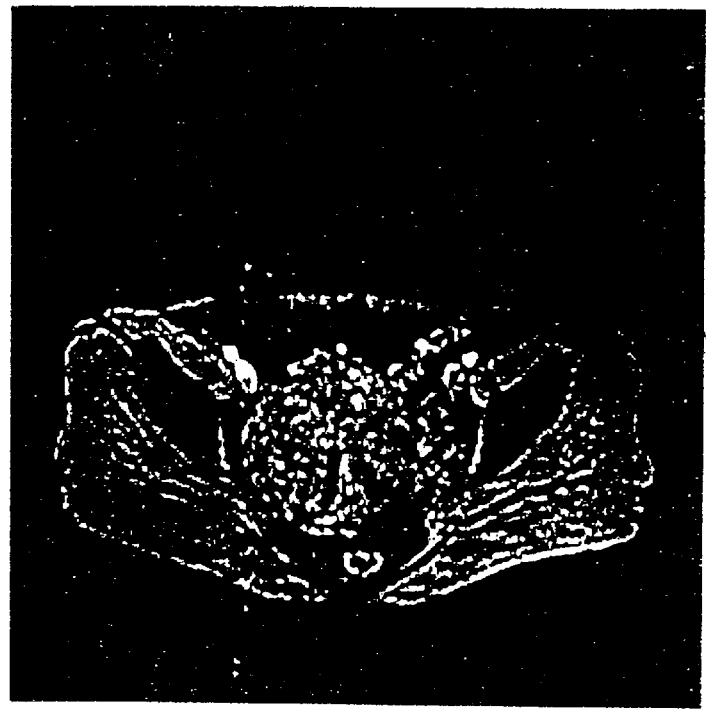
Figure 7C:
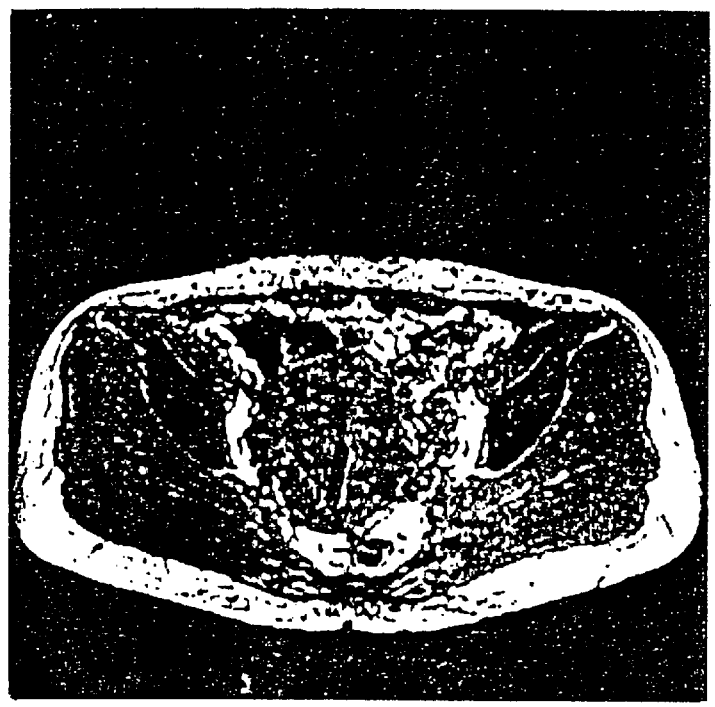
Figure 7D:
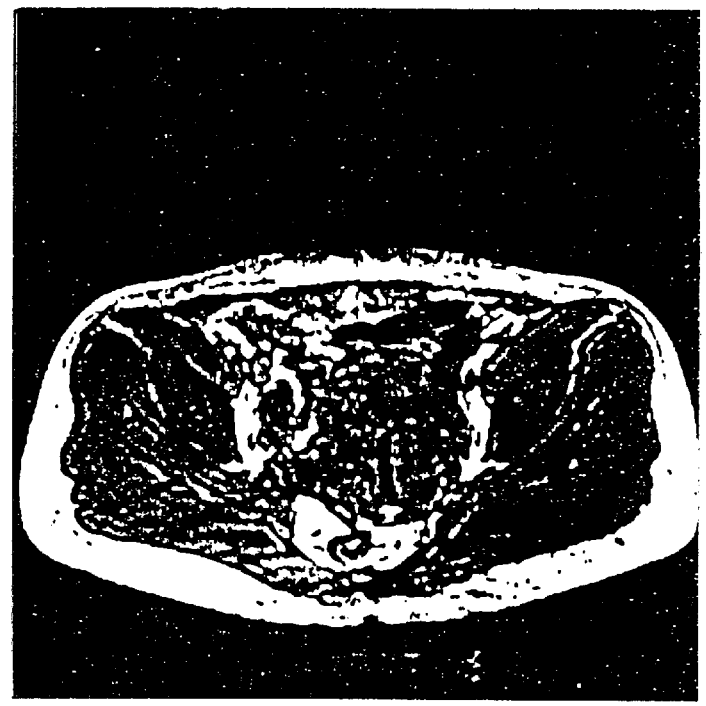

In the wrist images of FIGS. 6a–6d, the 3-DIWFAC water and fat images (6a and 6b respectively) demonstrate good separation, while the water-plus-fat image (6c) removes the chemical artifacts of the GRE image of FIG. 6d, which might obscure the diagnosis.

In the chemical-shift corrected water-plus-fat images, shadow artifacts between water and fat boundaries are not seen. Articular cartilage, bone thickness, and muscles/fat and other tissue boundaries are more accurately depicted (see, e.g. FIG. 6c). The chemical-shift corrected images also give a more uniform appearance without the bright and dark band artifacts that can increase the image intensity dynamic range.

When all the water-plus-fat imaging slices were compared with each other, it was noticed that the slices at the edges of the selected slab of the regular 3D GRE sequence showed altered image contrast, while in the 3-DIWFAC sequence the image contrast of those slices was not changed compared to the slices near to the slab center (FIGS. 9a–9d).

Figure 9A:
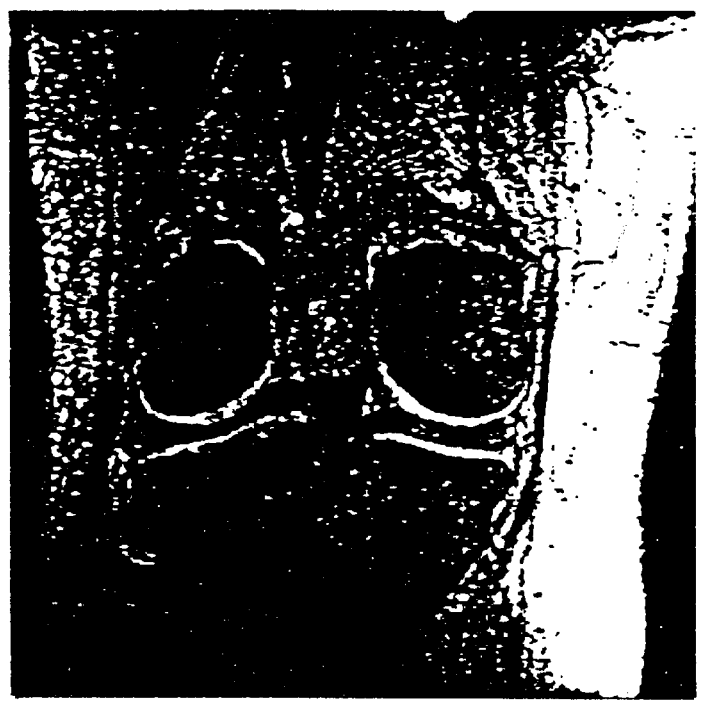
FIGS. 9a–9d are images of a knee taken by the preferred embodiment.
Figure 9B:
Figure 9C:
Figure 9D:

FIGS. 9a and 9b are 3-DIWFAC images and FIGS. 9c and 9d are 3-D GRASS images of the knee, respectively the third (9a, 9c) and fifth (9b, 9d) slices of a 3-D slab. The two 3-DIWFAC images have similar intensity values of subcutaneous fat, muscles, bone marrow, and cartilage, while the two regular 3-D GRE images show different tissue intensities and different image contrasts due to slab mis-registration between water and fat.

In the wrist study with receive bandwidth (BW) of ±10.42 kHz, the SNR of both water and fat increased by about 22% as expected from the theoretical relationship of $$SNR \propto \frac{1}{\sqrt{BW}}.$$

However, the regular 3D GRE sequence showed increased chemical-shift artifacts while the new sequence remained artifact free.

In summary, we have developed a new technique, 3-DIWFAC, for simultaneous 3D water-only, fat-only and water-plus-fat imaging. This technique saves half of the imaging time by alternately acquiring water and fat signal within a given TR period. These signals can then be reconstructed to give water-only, fat-only and water-plus-fat images. Since 3D imaging inherently requires long imaging time, this technique enables the acquisition of both sets of water and fat data which otherwise may not be obtainable in common clinical settings. While a preferred embodiment has been set forth, those skilled in the art will readily appreciate that other embodiments can be realized within the scope of the present invention. For example, the present invention can be adapted to 2D spin echo imaging. Therefore, the present invention should be construed as limited only by the appended claims.

TABLE 1

Comparison of the pulse length, minimum TE and minimum TR for the various binomial spatial-spectral excitations incorporated in the 3-DIWFAC sequence with full-echo signal acquisition.

| | Pulse Duration (msec) | Minimum TE (msec) | Minimum TR (msec) |
|---|---|---|---|
| 1-2-1 | 5.7 | 7.2 | 41.4 |
| 1-3-3-1 | 8.0 | 9.5 | 46.0 |
| 1-4-6-4-1 | 10.3 | 11.8 | 50.6 |
| EPI excitation | 14.4 | 15.9 | 58.8 |

TABLE 2

SNR measurement in the water and acetone phantom study.

| | SNR Saline | SNR Acetone | Saline/Acetone |
|---|---|---|---|
| 3-DIWFAC | | | |
| Water-plus-fat | 58.5 | 30.6 | 1.92 |
| Water-plus-fat (with segmentation to remove background noise) | 82.0 | 42.8 | 1.92 |

TABLE 2-continued

SNR measurement in the water and acetone phantom study.

| | SNR | | |
|---|---|---|---|
| | Saline | Acetone | Saline/Acetone |
| Water-only | 79.5 | 3.91 | 20.3 |
| Fat-only | 4.27 | 39.5 | 0.11 |
| Modified 3-DIWFAC | | | |
| Water-only | 75.3 | 3.88 | 19.4 |
| Fat-only | 3.55 | 41.6 | 0.09 |
| 3D GRE | | | |
| Non-suppressed | 82.1 | 40.0 | 2.05 |
| Fat-suppressed | 66.3 | 4.20 | 15.8 |
| Water-suppressed | 12.4 | 30.0 | 0.41 |

We claim:

1. A method of obtaining images of a plurality of constituents of an object using a magnetic field having a pulse sequence, the method comprising:

(a) providing a magnetic imaging device, (b) applying an electromagnetic signal having a waveform to the magnetic imaging device to cause the magnetic imaging device to form the magnetic field having the pulse sequence, the pulse sequence including alternating RF pulses for excitation of respective ones of the plurality of constituents and alternating phase-encoding lines for encoding of the respective ones of the plurality of constituents, the alternating RF pulses having a plurality of frequencies for the excitation of the respective ones of the plurality of constituents;

(c) using the magnetic field formed in step (b) to obtain a nuclear resonance signal from a profile of excitation of the object;

(d) separating portions of the signal obtained in step (c) corresponding to the plurality of constituents; and (e) forming the images in accordance with the portions separated in step (d).

2. The method of claim 1, wherein the plurality of constituents comprise water and fat, and wherein the plurality of frequencies comprise a first frequency for excitation of the water and a second frequency for excitation of the fat.

3. The method of claim 2, wherein the pulse sequence comprises phase-encoding lines for the water alternating with phase-encoding lines for the fat.

4. The method of claim 3, wherein the pulse sequence comprises a spatial-spectral excitation.

5. The method of claim 4, wherein the spatial-spectral excitation comprises an SLR 1-3-3-1 excitation.

6. The method of claim 4, wherein:

the pulse sequence further comprises a magnetic gradient sequence having a repetition time; and consecutive ones of the phase-encoding lines for the water and the fat are spaced by a time equal to one-half the repetition time.

7. The method of claim 1, further comprising (f) combining the images formed in step (e) to form a single image of the object with the plurality of constituents.

8. The method of claim 7, wherein step (f) comprises applying a chemical shift correction to the images formed in step (e).

9. The method of claim 1, wherein the pulse sequence is a 3D gradient echo sequence.

10. The method of claim 1, wherein the phase-encoding lines for all of the plurality of constituents lie within one data acquisition time.

11. The method of claim 1, wherein the pulse sequence comprises two phase encoding gradients and one frequency encoding gradient.

12. A system for obtaining images of a plurality of constituents of an object using a magnetic field having a pulse sequence, the system comprising:

(a) a magnetic imaging device;

(b) control means for applying an electromagnetic signal having a waveform to the magnetic imaging device to cause the magnetic imaging device to form the magnetic field having the pulse sequence, the pulse sequence including alternating RF pulses for excitation of the plurality of constituents and alternating phase-encoding lines for encoding of the respective ones of the plurality of constituents, the alternating RF pulses having a plurality of frequencies for the excitation of the respective ones of the plurality of constituents, and for using the magnetic field to obtain a profile of excitation of the object; and (c) analyzing means for separating portions of the profile corresponding to the plurality of constituents and for forming the images in accordance with the portions thus separated.

13. The system of claim 12, wherein the plurality of constituents comprise water and fat, and wherein the plurality of frequencies comprise a first frequency for excitation of the water and a second frequency for excitation of the fat.

14. The system of claim 13, wherein the pulse sequence comprises a phase-encoding lines for the water alternating with phase-encoding lines for the fat.

15. The system of claim 14, wherein the pulse sequence comprises a spatial-spectral excitation.

16. The system of claim 15, wherein the spatial-spectral excitation comprises a 1-3-3-1 excitation.

17. The system of claim 15, wherein:

the pulse sequence further comprises a magnetic gradient sequence having a repetition time; and consecutive ones of the phase-encoding lines for the water and the fat spaced by a time equal to one-half the repitition time.

18. The system of claim 12, wherein the analyzing means combines the images to form a single image of the object with the plurality of constituents.

19. The system of claim 18, wherein the analyzing means applies a chemical shift correction to the images formed in step (e).

20. The system of claim 12, wherein the pulse sequence is a 3D gradient echo sequence.

21. The system of claim 12, wherein the phase-encoding lines for all of the plurality of constituents lie within one data acquisition time.

22. The system of claim 11, wherein the pulse sequence comprises two phase encoding gradients and one frequency encoding gradient.

* * * * *